United States Patent
Shan et al.

(10) Patent No.: US 9,343,413 B2
(45) Date of Patent: May 17, 2016

(54) ESD PROTECTION FOR HIGH VOLTAGE APPLICATIONS

(75) Inventors: Yi Shan, Singapore (SG); Da-Wei Lai, Singapore (SG); Manjunatha Govinda Prabhu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/474,738

(22) Filed: May 18, 2012

(65) Prior Publication Data

US 2013/0308231 A1 Nov. 21, 2013

(51) Int. Cl.
*H02H 9/04* (2006.01)
*H01L 23/60* (2006.01)
*H01L 27/02* (2006.01)

(52) U.S. Cl.
CPC ............ *H01L 23/60* (2013.01); *H01L 27/0262* (2013.01); *H02H 9/046* (2013.01); *H01L 2924/0002* (2013.01); *Y10T 29/49155* (2015.01)

(58) Field of Classification Search
CPC ............ H01L 27/0262; H01L 2924/00; H01L 2924/0002; H01L 23/60; H02H 9/046; Y10T 29/49155
USPC ...................... 361/56; 257/173, 175
See application file for complete search history.

(56) References Cited

U.S. PATENT DOCUMENTS

| 5,903,420 A * | 5/1999 | Ham .................... H01L 27/0259 257/355 |
| 7,471,493 B1 | 12/2008 | Huang et al. |
| 8,508,517 B2 * | 8/2013 | Asada ................. H01L 27/0262 257/173 |
| 2002/0021538 A1* | 2/2002 | Chen et al. ........................ 361/56 |
| 2003/0214773 A1* | 11/2003 | Kitagawa ............ H01L 27/0251 361/118 |
| 2006/0258067 A1* | 11/2006 | Jeon ..................... H01L 27/0262 438/154 |
| 2012/0099229 A1 | 4/2012 | Domanski et al. |

FOREIGN PATENT DOCUMENTS

| CN | 1665026 A | 9/2005 |
| CN | 101290933 A | 10/2008 |
| DE | 102011054700 | 4/2012 |
| TW | 463442 B | 11/2001 |

* cited by examiner

*Primary Examiner* — Stephen W Jackson
*Assistant Examiner* — Ann Hoang
(74) *Attorney, Agent, or Firm* — Horizon IP Pte. Ltd.

(57) ABSTRACT

An ESD module includes an ESD circuit coupled between a first source and a second source. A trigger circuit is also included in the ESD module for activating the ESD circuit to provide a low resistance current path between the first and second sources. The trigger circuit includes a reverse diode between the first source and the ESD circuit or between the second source and main ESD circuit. The trigger circuit provides a low trigger voltage to activate the ESD circuit.

20 Claims, 3 Drawing Sheets

ESD PROTECTION FOR HIGH VOLTAGE APPLICATIONS

BACKGROUND

Electrostatic discharge (ESD) generated from static electricity is usually characterized by fast transient high voltage discharge. An ESD event can occur in electrical and electronic circuits, such as an integrated circuit. It can create sufficiently high voltage to cause destructive breakdown of devices connected to, for example, the inputs and/or outputs of the integrated circuits.

Therefore, it is desirable to have an ESD protection circuit integral within the IC to effectively protect sensitive input and/or output circuits from an ESD event.

SUMMARY

An ESD module is presented. The ESD module includes an ESD circuit coupled between a first source and a second source. A trigger circuit is also included in the ESD module for activating the ESD circuit to provide a low resistance current path between the first and second sources. The trigger circuit includes a reverse diode between the first source and the ESD circuit or between the second source and main ESD circuit. The trigger circuit provides a low trigger voltage to activate the ESD circuit.

In another embodiment, a device is disclosed. The device includes a substrate prepared with an ESD region therein. The ESD region includes an ESD module. The ESD module includes an ESD circuit coupled between a first source and a second source. A trigger circuit is also included in the ESD module for activating the ESD circuit to provide a low resistance current path between the first and second sources. The trigger circuit includes a reverse diode between the first source and the ESD circuit or between the second source and main ESD circuit. The trigger circuit provides a low trigger voltage to activate the ESD circuit.

A method of manufacturing a device is presented. The method includes providing a substrate and forming an ESD region in the substrate. The ESD region includes an ESD module. The ESD module includes an ESD circuit coupled between a first source and a second source. The ESD module also includes a trigger circuit for activating the ESD circuit to provide a low resistance current path between the first and second sources. The trigger circuit includes a reverse diode between the first source and the ESD circuit or between the second source and main ESD circuit. The trigger circuit provides a low trigger voltage to activate the ESD circuit.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. In one embodiment, the devices include an ESD circuit. The ESD circuit, for example, is activated during an ESD event to dissipate ESD current. The devices, for example, may be any type of semiconductor devices, such as integrated circuits (ICs). In one embodiment, the device is a memory IC. For example, the memory IC is a non-volatile memory (NVM) IC. In other embodiments, the device may include a NVM module, along with other modules. Other types of ICs may also be useful. The ICs can be incorporated into or used with, for example, electronic products, computers, cell phones, and personal digital assistants (PDAs). The devices may also be incorporated into other types of products.

Figure 1:
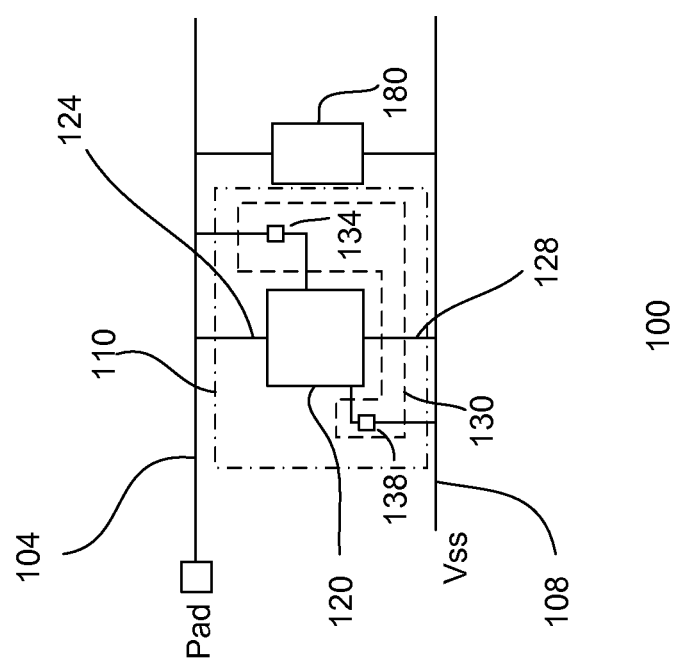
FIG. 1 shows a simplified block diagram of a portion of an embodiment of a device.

FIG. 1 shows a block diagram of a portion of an embodiment of a device 100. The portion includes an ESD block or module 110. The ESD module includes a main ESD circuit 120 and a trigger circuit 130. The ESD circuit, in one embodiment, is a silicon control rectifier based (SCR) ESD circuit. Providing other types of ESD circuits may also be useful. The SCR-based ESD circuit includes first and second ESD terminals 124 and 128. The first terminal is coupled to a first source 104 and the second terminal is coupled to a second source. In one embodiment, the first source is a pad of the device and the second source is a low power source or rail 108. The low power source, in one embodiment, is $V_{ss}$ or ground. The pad, for example, is an I/O pad of the device. In one embodiment, the pad is coupled to a high voltage signal. The high voltage signal is higher than the normal power supply voltage, such as $V_{dd}$, of the device. The high voltage signal may be $V_{pp}$. The high voltage signal, for example, may be used as a programming signal for NVM ICs or modules. Other types of voltage signals may also be useful. For example, the pad may be coupled to a normal voltage signal, such as $V_{dd}$.

The ESD trigger circuit, under ESD conditions such as an ESD zap or pulse, triggers or activates the ESD circuit to create a current path between the pad to ground to dissipate the ESD current. The ESD trigger circuit, in one embodiment, includes a diode. The diode is a reverse diode, having an anode directly or indirectly coupled to the low power source and a cathode directly or indirectly coupled to the pad. The diode can be tailored or tuned to have an appropriate trigger mechanism to achieve quick triggering of the ESD circuit. In one embodiment, the diode is designed to have a diode breakdown voltage ($V_{dbd}$) which is higher than any voltage signal received at the pad during normal operation. For example, $V_{dbd}$ is greater than Vpp. This ensures that the ESD is not triggered inadvertently or unintentionally during normal operation when a pad voltage signal is provided at the pad. The reverse diode may be designed to have a sufficiently high leakage current under an ESD condition to trigger the ESD circuit. Alternatively, the reverse diode may be designed to have a low first breakdown voltage and a sufficient second breakdown current to trigger the ESD circuit quickly. The low first breakdown voltage should be larger than any voltage signal received at the pad during normal operation. For example, the first breakdown voltage may be greater than about 15 V for the case of a pad voltage signal of about 12 V while the second breakdown current may be greater than about 200 mA. Having a second breakdown current of greater than about 200 mA results in quick triggering of the ESD circuit without latch up.

In one embodiment, the ESD trigger circuit includes multiple triggers. For example, the ESD trigger sub-circuit includes first and second triggers 134 and 138. The triggers, in one embodiment, are reverse diodes. The first trigger, as shown, includes a first anode indirectly coupled to the low power source via the ESD circuit and a first cathode coupled directly to the pad. As for the second trigger, it includes a second anode coupled directly to the low power source and a second cathode coupled indirectly to the pad via the ESD circuit.

The triggers are designed to have $V_{dbd}$s which are greater than any pad signal received at the pad. In one embodiment, the triggers are designed to have low $V_{dbd}$s which are greater than pad voltage signal and a sufficiently high second breakdown current under an ESD condition. For example, the first breakdown voltage may be greater than about 15 V for a pad voltage signal of about 12 V while the second breakdown current may be greater than about 200 mA under an ESD condition. The high leakage current flowing through the diodes under an ESD condition enables quick activation of the ESD circuit without latch up. Furthermore, providing multiple triggers improves performance of the ESD circuit. For example, the ESD circuit can quickly be triggered under an ESD condition, even for high voltage applications.

In one embodiment, the first and second triggers are designed to have the same characteristics. For example, the diodes of the first and second triggers are the same. Providing first and second triggers having different characteristics may also be useful.

An internal circuit 180 is coupled to the first and second sources. For example, the internal circuit is coupled to the pad and the low power rail. The internal circuit, in one embodiment, is an I/O circuit. The I/O circuit may be, for example, an input receiver. Other types of internal circuits, such as an output driver, may also be useful. The ESD circuit protects the internal circuit from damage from an ESD event.

Figure 2:
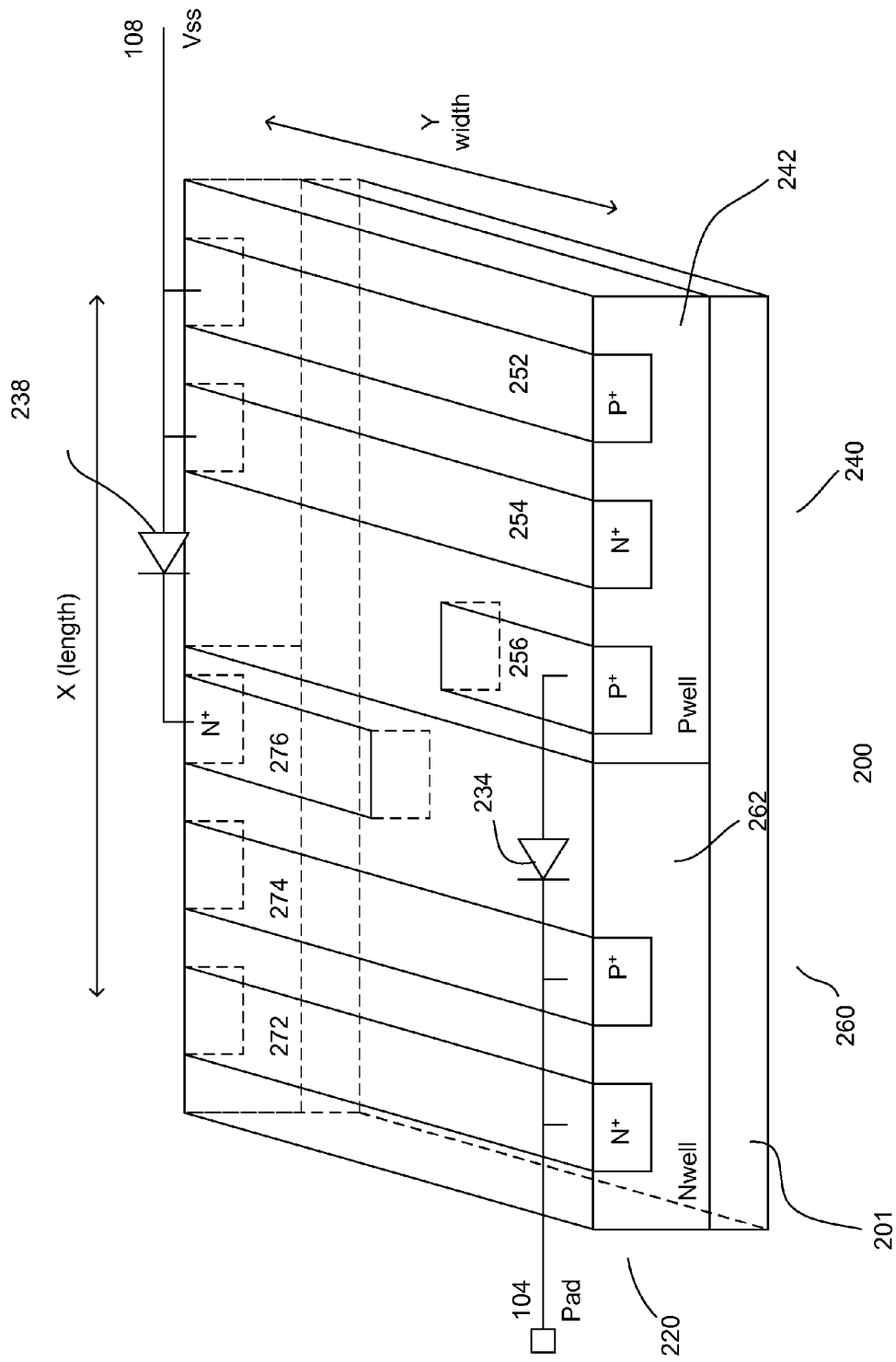
FIG. 2 shows an embodiment of an ESD circuit.

FIG. 2 shows a simplified isometric view of an embodiment of a device 200. The device includes a semiconductor substrate 201 in/on which it is formed. The substrate, in one embodiment, is a silicon substrate. Other types of semiconductor substrates, including semiconductor-on-insulator substrates may also be useful. The substrate may be lightly doped with p-type dopants. Other types of doping concentrations may also be useful. In other embodiment, the substrate is doped with n-type dopants. P-type dopants, for example, include boron (B), aluminum (Al), indium (In) or a combination thereof, while n-type dopants can include phosphorus (P), arsenic (As), antimony (Sb) or a combination thereof.

The device includes an ESD module which includes an ESD circuit 220. The ESD circuit is formed in the substrate. For example, the ESD circuit is formed in an ESD region of the device. As shown, the ESD region is rectangular in shape having a first or x direction and a second or y direction. The x direction may be referred to as the length direction and the y-direction may be referred to as the width direction. Providing an ESD region with other shapes may also be useful. The ESD region, for example, is isolated from other regions by an ESD isolation region (not shown). The ESD isolation region, for example, surrounds the ESD region. In one embodiment, the isolation region is a trench isolation region. The isolation region, for example, is a shallow trench isolation (STI) region. Other types of isolation regions may also be useful.

The ESD circuit 220, in one embodiment, is a SCR-based ESD circuit. In accordance with one embodiment, the SCR-based ESD circuit includes first and second portions 240 and 260 disposed in the ESD region. The first and second portions, as shown, are disposed along the length direction of the ESD region. For example, a portion occupies the complete width of the ESD region, with both portions occupying the complete length of the ESD region. The portions serve as terminal portions of the ESD circuit. For example, the first portion serves as a first terminal and the second portion serves as a second terminal. In one embodiment, the first terminal provides coupling to a pad 104 and the second terminal portion provides coupling to the low power source. In one embodiment, the pad is an I/O pad coupled to a high voltage signal, such as Vpp. Other configurations of the portions may also be useful.

The first portion includes a first portion (FP) well 242 formed in the substrate. The FP well includes first polarity type dopants. In one embodiment, the FP well is lightly doped with first polarity type dopants. Providing the FP well with other dopant concentrations may also be useful. The first polarity type, in one embodiment, is p-type. For example, the FP well is a lightly doped p-type well.

The second portion includes a second portion (SP) well 262 formed in the substrate. The SP well, in one embodiment, includes second polarity type dopants. In one embodiment, the SP well is lightly doped with second polarity type dopants. Providing an SP well with other dopant concentrations may also be useful. The second polarity type is of the opposite polarity type as, for example, the FP well. The SP well, in one embodiment, is a lightly doped n-type well.

Although wells are described, it is understood that the FP or SP well may be provided by the substrate. In some instances, such as if the substrate is an appropriately doped substrate, the FP or SP well may be provided by the substrate. For example, in the case of an appropriately p-type doped substrate, the FP well may be provided by the substrate.

The first portion includes first, second, and third FP contact regions 252, 254 and 256; the second portion includes first, second and third SP contact regions 272, 275 and 276. A contact region, for example, is disposed in a respective portion of the ESD region and extends along the width direction. For example, a contact region extends the complete width of an ESD region. Adjacent contact regions are disposed in the ESD region in the length direction.

In one embodiment, first and third contact regions of a sub-portion are of the same polarity type as their respective sub-portion doped well and the second contact region is of the opposite polarity type as its respective sub-portion well. For example, the first and third contact regions in the FP well are first polarity type contact regions (same as FP well) and the second contact region of the FP well is of the second polarity type; the first and third contact regions in the SP well are second polarity type contact regions (same as SP well) and the second contact region of the SP well is of the first polarity type. Providing other configurations of first and second contact regions may also be useful.

Illustratively, the first and second contact regions extend the complete width of the ESD region. As for the third contact regions, they extend from opposite ends of the ESD region in the width direction. In one embodiment, the third contact regions do not overlap each other. In other embodiments, the third contact regions may be overlapping contact regions without extending the complete width of the ESD region. In yet other embodiments, the third contact regions may extend the complete width of the ESD regions, like the first and second contact regions. Other configurations of the contact regions may also be useful.

The contact regions serve as contact regions to the pad and the low power source or $V_{ss}$. In one embodiment, the first and second contact regions of a portion and the third contact region of the other portion serve as a common terminal of the ESD circuit. In one embodiment, the first and second contact regions of the first portion and the third contact region of the second portion serve as a common terminal for the low power source while the first and second contact regions of the second portion and the third contact region of the first portion serve as a common terminal for the pad.

The common terminal for the pad source forms a first trigger 234 of a trigger circuit for the ESD circuit. For example, a first reverse diode is formed between the connections between the third FP contact region and the second SP contact region. The anode of the first reverse diode is indirectly coupled to $V_{ss}$ by the connection to the third FP contact region and the cathode is coupled directly to the pad. The common terminal for the low power source forms a second trigger 238. For example, a second reverse diode is formed between the connections between the third SP contact region and the second FP contact region. The anode of the second reverse diode is directly coupled to $V_{ss}$ and the cathode is indirectly coupled to the pad by the connection to the third SP contact region.

The contact regions, in one embodiment, are heavily doped regions. Other dopant concentrations for the contact regions may also be useful. In one embodiment, the contact regions are selected with appropriate dopant concentration to achieve the desired diode characteristics, as previously described. Due to the numerous implantation processes employed in forming a device or IC, the tailoring of the diodes can be easily achieved with existing processes. For example, the ESD circuit can be formed without requiring additional process or masking steps.

Figure 3:
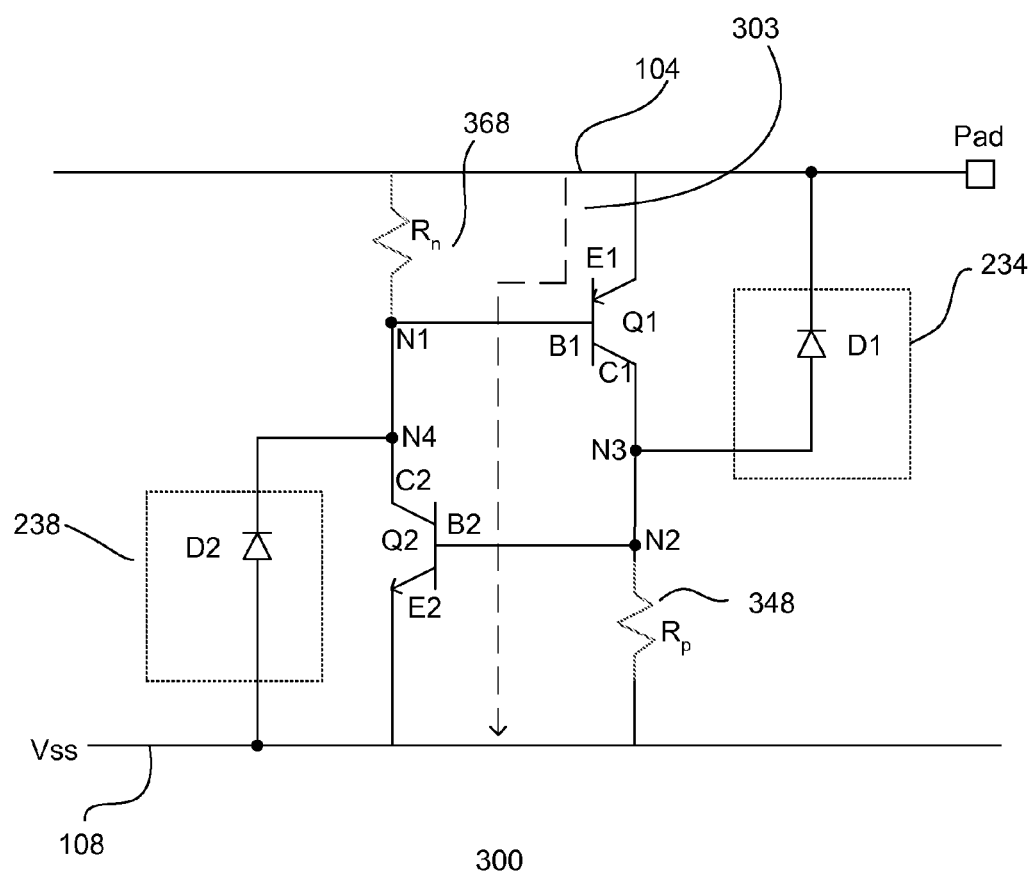
FIG. 3 shows a circuit diagram of an embodiment of an ESD circuit.

FIG. 3 shows a simplified parasitic circuit 300 formed by an embodiment of an ESD circuit, such as that described in FIG. 2. As shown, the parasitic a pnpn-based structure. The parasitic circuit, as shown, includes a pair of parasitic bipolar transistors Q1 and Q2. The first transistor Q1 is a PNP transistor having a first emitter terminal E1, a first collector C1 and a first base B1. As for the Q2, it includes a second emitter terminal E2, a second collector C2 and a second base B2. The parasitic circuit also includes a first resistor Rp, which is the parasitic resistance of the FP well (e.g., p-type well or ESD body), and a second resistor Rn formed by the parasitic resistance of the SP well (e.g., n-type well).

In one embodiment, the first emitter terminal E1 of Q1 is coupled to the pad and C1 is coupled to the low power source or $V_{ss}$ by Rp. The second emitter terminal E2 of Q2 is coupled to $V_{ss}$ and C2 is coupled to the pad via Rn. The base B1 is coupled to node N1, which is common to Rn and C2 while B2 is coupled to node N2, the common terminal between Rp and C1. The various terminals and nodes of the transistors correspond to various contact regions and wells of the ESD circuit, as described in FIG. 2. For example, Table 1 shows an embodiment of corresponding elements of the parasitic and ESD circuits.

TABLE 1

| Parasitic Circuit | ESD circuit |
| --- | --- |
| B1 | SP well |
| C1 | FP well |
| E1 | second SP contact region |

TABLE 1-continued

| Parasitic Circuit | ESD circuit |
| --- | --- |
| B2 | FP well |
| C2 | SP well |
| E2 | second FP contact region |
| N1 | SP well |
| N2 | FP well |

Due to the external connections to the Pad and $V_{ss}$, a trigger circuit is formed. In one embodiment, the trigger circuit includes first and second triggers 234 and 238. The first and second triggers include first and second reverse diodes D1 and D2. The first diode includes a first anode and a first cathode and D2 includes a second anode and a second cathode. The first anode of D1 is coupled to node N3, which, for example, corresponds to the third FP contact region and the cathode is coupled to the pad; the second anode of D2 is coupled to Vss and the second cathode is coupled to node N4, which, for example, corresponds to the third SP contact region.

Under ESD conditions, such as an ESD zap at the pad, the triggers activate the ESD circuit, forming a low resistance current path 303. The low resistance current path discharges ESD current from the pad to Vss. Alternatively, when an ESD zap is at the $V_{ss}$, the triggers activate the ESD circuit, forming a low resistance current path which discharges ESD current from the $V_{ss}$ to the pad. By tailoring the dopant concentrations of the contact regions and wells, the triggers can have a low trigger voltage with a sufficiently high $V_{dbd}$ to avoid inadvertent switching on of the ESD circuit.

In one embodiment, both reverse diodes have a high leakage current under an ESD pulse. An ESD zap causes sufficient leakage current to flow through the SP well, diodes and FP well to forward bias the PNP's emitter/base junction and NPN's emitter/base junction to trigger SCR. In another embodiment, both reverse diodes have a low first breakdown voltage and a sufficient second breakdown current. An ESD zap causes the reverse diode to break down. This results in a sufficient ESD current to flow through the FP well, diodes and SP well to forward bias the PNP's emitter/base junction and NPN's base/emitter junction to trigger SCR.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An ESD module comprising:
    an ESD circuit coupled between a first source and a second source, wherein the ESD circuit is a silicon controlled rectifier (SCR) based ESD circuit having a parasitic circuit with first and second junction transistors, the first junction transistor includes a first collector, a first base and a first emitter, the second junction transistor includes a second collector, a second base and a second emitter, the SCR based ESD circuit comprises an ESD region having a width and length direction with
        a first ESD well in a device region having first polarity type dopants, a second ESD well in the device region having second polarity type dopants, wherein the first and second wells abut in the width direction, first, second and third first ESD contacts in the first ESD well, wherein the first and third first ESD contacts include first polarity type dopants and the second first ESD contact includes second polarity type dopants, first, second and third second ESD contacts in the second ESD well, wherein the first and third second ESD contacts include second polarity type dopants and the second second ESD contact includes first polarity type dopants, and wherein the first and second first ESD contacts and the first and second second ESD contacts extend the width of the device region completely and the third first ESD contact and the third second ESD contact extend the width of the device region partially from opposite sides of the device region; and a trigger circuit for activating the ESD circuit to provide a low resistance current path between the first and second sources, the trigger circuit comprising a first trigger between the first source and the first collector of the first junction transistor of the parasitic circuit of the ESD circuit, wherein the first collector is the first ESD well, and a second trigger between the second source and the second collector of the second junction transistor of the parasitic circuit of the ESD circuit, wherein the second collector is the second ESD well, and wherein the trigger circuit provides a low trigger voltage to activate the ESD circuit.

2. The ESD module in claim 1 wherein the first source comprises a pad which receives a high voltage signal ($V_{pp}$).

3. The ESD module in claim 2 wherein the second source comprises a low power source.

4. The ESD module in claim 1 wherein the first and second triggers comprise first and second diodes having a sufficiently high leakage current under positive ESD pulse to trigger the ESD circuit.

5. The ESD module in claim 1 wherein the first and second triggers comprise first and second diodes having a low first breakdown voltage and sufficient second breakdown current to trigger the ESD circuit.

6. The ESD module in claim 1 wherein:
the first junction transistor is a first type junction transistor comprising
the first collector which is the first ESD well,
the first base which is the second ESD well, and
the first emitter which is the second second ESD contact in the second ESD well; and
the second junction transistor is a second type junction transistor comprising
the second collector which is the second ESD well,
the second base which is the first ESD well, and
the second emitter which is the second first ESD contact in the first ESD well.

7. The ESD module in claim 1 wherein:
the first trigger comprises first and second first trigger terminals,
the first first trigger terminal is coupled to the first collector of the first junction transistor through the third first ESD contact, and
the second first trigger terminal is coupled to the first source and the first and second second ESD contacts in the second ESD well; and
the second trigger comprises first and second second trigger terminals, the first second trigger terminal is coupled to the second collector of the second junction transistor through the third second ESD contact, and
the second second trigger terminal is coupled to the second source and the first and second first ESD contacts in the first ESD well.

8. The ESD module in claim 7 wherein the first source comprises a pad which receives $V_{pp}$ and the second source comprises $V_{ss}$.

9. The ESD module in claim 7 wherein:
the first trigger comprises a first diode, wherein
the first first trigger terminal comprises a first anode terminal of the first diode, and
the second first trigger terminal comprises a first cathode terminal of the first diode; and
the second trigger comprises a second diode, wherein
the first second trigger terminal comprises a second cathode terminal of the second diode, and
the second second trigger terminal comprises a second anode terminal of the second diode.

10. The ESD module in claim 9 wherein the first and second diodes have a diode breakdown voltage ($V_{dbd}$) which is greater than any voltage at the first source.

11. A device comprising:
a substrate prepared with an ESD region therein, the ESD region having a length and width direction, the ESD region with an ESD module comprising
a silicon rectifier controlled (SCR) based ESD circuit coupled between a first source and a second source, wherein the ESD circuit comprises
a first ESD well of a first polarity type in the ESD region,
a second ESD well of a second polarity type in the ESD region, wherein the first and second ESD wells abut in a device region along the width direction,
a plurality of first ESD contacts of first and second polarity type disposed in the first ESD well,
a plurality of second ESD contacts of first and second polarity type disposed in the second ESD well, and
wherein one first ESD contact disposed in the first ESD well proximate to an interface of the first and second ESD wells and one second ESD contact disposed in the second ESD well proximate to the interface of the first and second ESD wells extend a partial width of the ESD region from opposite sides of the device region; and
a trigger circuit for activating the ESD circuit to provide a low resistance current path between the first and second sources, the trigger circuit comprising
a first trigger between the first source and a first collector of a first transistor of a parasitic circuit of the ESD circuit, wherein the first collector is the first ESD well in the ESD region, and
a second trigger between the second source and a second collector of a second transistor of the parasitic circuit of the ESD circuit, wherein the second collector is the second ESD well in the ESD region, and
wherein the trigger circuit provides a low trigger voltage to activate the ESD circuit.

12. The ESD module in claim 11 wherein:
the first source comprises a pad which receives a high voltage signal ($V_{pp}$); and
the second source comprises a low power source.

13. The ESD module in claim 12 wherein:
the plurality of first ESD contacts comprise first, second and third first ESD contacts in the first ESD well, wherein the first and third first ESD contacts are of the first polarity type and the second first ESD contact is of the second polarity type;

the plurality of second ESD contacts comprise first, second and third second ESD contacts in the second ESD well, wherein the first and third second ESD contacts are of the second polarity type and the second second ESD contact is of the first polarity type; and wherein the first and second first ESD contacts and the first and second second ESD contacts extend the width of the device region completely and the third first and third second ESD contacts extend the width of the device region partially from opposite sides of the device region.

14. The ESD module in claim 13 wherein:
the first transistor is a first type transistor comprising
the first collector which is the first ESD well,
a first base which is the second ESD well, and
a first emitter which is the second second ESD contact in the second ESD well; and
the second transistor is a second type transistor comprising
the second collector which is the second ESD well,
a second base which is the first ESD well, and
a second emitter which is the second first ESD contact in the first ESD well.

15. The ESD module in claim 14 wherein:
the first trigger comprises first and second first trigger terminals,
the first first trigger terminal is coupled to the first collector of the first transistor through the third first ESD contact, and
the second first trigger terminal is coupled to the first source and the first and second second ESD contacts in the second ESD well; and
the second trigger comprises first and second second trigger terminals,
the first second trigger terminal is coupled to the second collector of the second transistor through the third second ESD contact, and
the second second trigger terminal is coupled to the second source and the first and second first ESD contacts in the first ESD well.

16. The ESD module in claim 15 wherein:
the first trigger comprises a first diode, wherein
the first first trigger terminal comprises a first anode terminal of the first diode, and
the second first trigger terminal comprises a first cathode terminal of the first diode; and
the second trigger comprises a second diode, wherein
the first second trigger terminal comprises a second cathode terminal of the second diode, and
the second second trigger terminal comprises a second anode terminal of the second diode.

17. The ESD module in claim 16 wherein the first and second diodes have a diode breakdown voltage ($V_{dbd}$) which is greater than any voltage at the first source.

18. The ESD module in claim 11 wherein:
the first trigger comprises first and second first trigger terminals, the first trigger includes a first diode having a first anode and a first cathode terminal,
the first anode terminal is coupled to the first first trigger terminal which is coupled to the first collector,
the first cathode terminal is coupled to the first source; and
the second trigger comprises first and second second trigger terminals, the second trigger includes a second diode having a second anode and a second cathode terminal,
the second anode terminal is coupled to the first second trigger terminal which is coupled to the second source,
the second cathode terminal is coupled to the second second trigger terminal which is coupled to the second collector.

19. The ESD module in claim 18 wherein the first and second diodes have a diode breakdown voltage ($V_{dbd}$) which is greater than any voltage at the first source.

20. A method of manufacturing a device comprising:
providing a substrate defined with an ESD region having length and width directions; and
forming an ESD module in the ESD region in the substrate, wherein forming the ESD module comprises
forming a parasitic circuit of the ESD module having first and second transistors which includes
forming a first ESD well of a first polarity type,
forming a second ESD well of a second polarity type, wherein the first and second ESD wells abut in a device region along the width direction,
forming a plurality of first ESD contacts of first and second polarity type in the surface of the substrate in the first ESD well and a plurality of second ESD contacts of first and second polarity type in the surface of the substrate in the second ESD well, wherein one first ESD contact disposed in the first ESD well proximate to an interface of the first and second ESD wells and one second ESD contact disposed in the second ESD well proximate to the interface of the first and second ESD wells extend a partial width of the ESD region from opposite sides of the device region, and
forming a trigger circuit for activating the ESD module to provide a low resistance current path between the first and second sources, wherein the trigger circuit includes
a first trigger between the first source and a first collector of the first transistor, the first collector is the first ESD well in the ESD region and
a second trigger between the second source and a second collector of the second transistor, the second collector is the second ESD well, and
wherein the trigger circuit provides a low trigger voltage to activate the ESD circuit.

* * * * *